United States Patent
Ren et al.

(10) Patent No.: US 7,464,011 B2
(45) Date of Patent: Dec. 9, 2008

(54) METHOD FOR DETERMINING ADDENDUM AND BINDER SURFACES OF SPRINGBACK COMPENSATED STAMPING DIES

(75) Inventors: Feng Ren, Canton, MI (US); Zhiyong Cedric Xia, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 437 days.

(21) Appl. No.: 11/307,189

(22) Filed: Jan. 26, 2006

(65) Prior Publication Data

US 2007/0173964 A1    Jul. 26, 2007

(51) Int. Cl.
*G06F 17/50* (2006.01)
*G06F 19/00* (2006.01)

(52) U.S. Cl. .............. 703/2; 700/98; 700/118; 700/163

(58) Field of Classification Search ...... 703/2, 703/7; 700/165, 167, 174–176, 98, 118, 700/163, 182
See application file for complete search history.

(56) References Cited

U.S. PATENT DOCUMENTS 6,947,809 B2     9/2005   Ren et al.
2006/0293776 A1*  12/2006  Hillman et al. ............... 700/98

* cited by examiner

*Primary Examiner*—Thai Phan
(74) *Attorney, Agent, or Firm*—Dickinson Wright PLLC; David Kelley

(57) ABSTRACT

A method for determining compensated addendum and binder surfaces as part of a springback compensated stamping die for producing a stamped part includes modeling of the existing addendum surface and binder surface of the stamping die. The addendum and binder surfaces are modified according to a number of compensatory surface displacements and in-plane rotations required for springback compensation of the finished stamped part. Following this modification, the stamped part may be separated from the addendum and binder without a loss of dimensional accuracy.

8 Claims, 2 Drawing Sheets

METHOD FOR DETERMINING ADDENDUM AND BINDER SURFACES OF SPRINGBACK COMPENSATED STAMPING DIES

TECHNICAL FIELD

The present invention relates to a method and system for determining the dimensional specifications of a stamping die, such as a draw die, for producing a stamped part. The dimensions of the die are compensated to avoid distortion of the part due to springback of the metal being stamped, including springback of not only the part being produced, but also the addendum and binder surfaces.

BACKGROUND

"Springback" is a term used to describe the geometrical distortion of a stamped part after its removal from a stamping die and, and particularly after trimming of the stamped drawn shell to remove the addendum and binder material. In order to obtain the correct part dimensions, the stamping die must be compensated to accommodate springback. Compensation must be provided not only for the part itself, but also for the binder and addendum surfaces, because these surfaces contribute to springback. U.S. Pat. No. 6,947,809, which assigned to assignee of the present invention, discloses a method for achieving springback compensation of a part, but which does not handle the problem addressed by the present invention with respect to addendum and binder surfaces.

SUMMARY OF THE INVENTION

A method for determining compensated addendum and binder surfaces of a springback compensated stamping die, for producing a stamped part, includes the steps of calculating a plurality of compensatory surface displacements of the die within the boundaries of the stamped part, in order to minimize springback of the part itself. This calculation is made using a springback compensation model such as that disclosed in U.S. Pat. No. 6,947,809, which is hereby incorporated by reference in its entirety into this specification. Following the calculation of the compensatory surface displacement for the part, the existing addendum surface and binder surface of the die are discretized as an elastic shell structure using a finite element model. Then, the previously determined plurality of compensatory surface displacements are imposed as boundary conditions in the finite element model of the addendum surface and binder surface and the finite element model is used to conduct an analysis of the existing addendum and binder surfaces to determine compensated addendum binder surfaces corresponding to the compensated surface of the die within the boundaries of the stamped part.

The elastic shell structure utilized according to the present method is preferably modeled with a defined thickness and the defined elastic modulus corresponding to the thickness and elastic modulus of material used to fabricate the stamped part. If desired, the analysis of existing addendum and binder surfaces may be limited to an analysis of the addendum surface alone by constraining a plurality of finite element nodes corresponding to the binder surface. The surface quality of parts produced by a die produced according to the present method may be enhanced by using in-plane rotations of the surfaces of the die calculated by the springback compensation model, which are imposed as additional boundary conditions in the finite element model of the addendum surface and the binder surface.

It is an advantage of a system and method according to the present invention that stamped parts may be tooled in much less time than is needed for traditional methods, because springback of not only the finished part, but also the addendum and binder surfaces of the stamping from which finished part is trimmed, may be accommodated and compensated.

A further advantage of a method according to present invention resides in the fact that the quality of the final die surface is smooth enough for numerical control machining, while maintaining fidelity with the characteristics of the original die surface.

Other advantages, as well as features and objects of the present invention will become apparent to the reader of this specification.

DETAILED DESCRIPTION OF THE PREFERRED EMBODIMENTS

Figure 1:
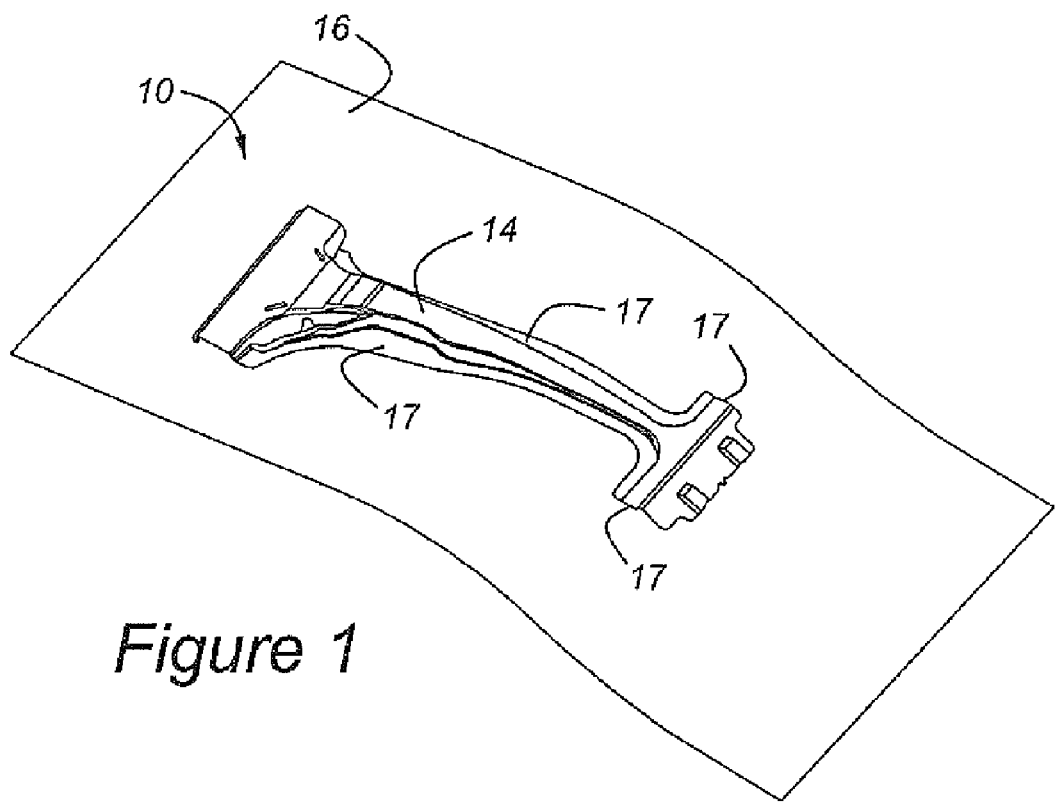
FIG. 1 illustrates an original die surface for producing a stamped B-pillar for an automotive vehicle according to the present invention.

As shown in FIG. 1, original die surface 10, which in this case determines the finished surface of an automotive body B-pillar, includes an original part surface 14, and a binder surface 16. The binder portion of a stamping blank is used to maintain the blank at a specified position within the stamping die. An addendum surface, 17, transitions between binder surface 16 and part surface 14.

Figure 2:
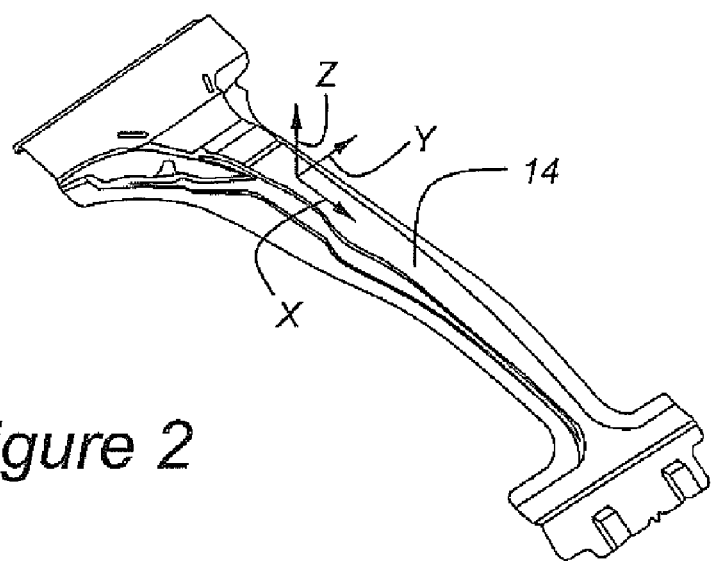
FIG. 2 illustrates a compensated part surface having springback compensation.

FIG. 2 illustrates part surface 14 after compensatory surface displacements in three dimensions—X, Y and Z—and in-plane rotations of the die within the boundaries of stamped part surface 14 have been calculated using a finite element springback compensation model. This model produces a finite element mesh for each part of the part surface 14 and determines adjustments needed for the three dimensional positioning of each of the mesh elements to produce a part which meets design intent notwithstanding springback.

Figure 3:
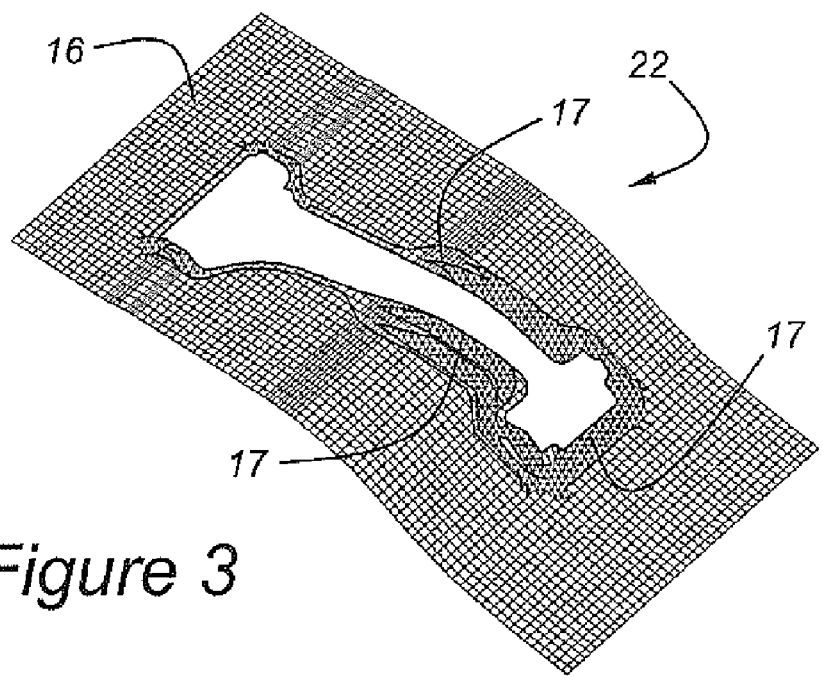
FIG. 3 illustrates a finite element mesh generated for a addendum and binder surfaces according to the present invention.

FIG. 3 illustrates a finite element mesh, 22, which includes only addendum 17 and binder 16. This mesh is in essence a discretized model of the existing addendum and binder surfaces, which are modeled as an elastic shell structure with a defined thickness and a defined elastic modulus. Although the defined thickness and elastic modulus are preferably selected to match that of the material from which the part to be stamped, it is sometimes necessary to upgage the material in order to avoid certain surface imperfections.

Figure 4:
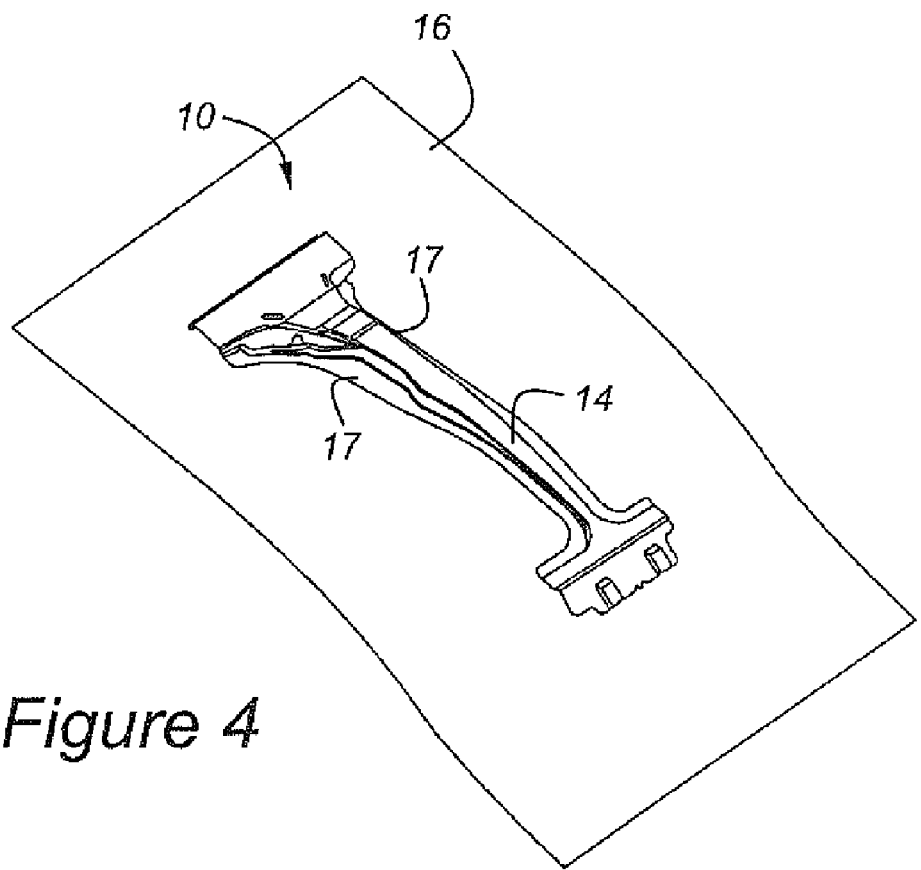
FIG. 4 illustrates a fully compensated die surface including a part surface and an addendum/binder surface according to the present invention.

The model of FIG. 3 is run with inputs including the compensatory surface displacements and in-plane rotations which are developed in connection with the compensated part surface shown in FIG. 2. Using the model depicted in FIG. 3 and these compensations, the model of FIG. 4 may be produced. The results presented in FIG. 4 include not only part surface 14 but also addendum surface 17 and binder surface 16. Data from the simulation represented in FIG. 4 may be used as inputs to a numerical control machine to produce an actual die for try-out and further adjustment.

In certain cases it may not be necessary to update the binder surface, and analysis of the existing addendum and binder surfaces may therefore be limited to analysis of the addendum surface by constraining a plurality of finite element nodes corresponding to said binder surface and by using data from such nodes as inputs to the finite element analysis of the addendum surface.

Although the present invention has been described in connection with particular embodiments thereof, it is to be understood that various modifications, alterations, and adaptations may be made by those skilled in the art without departing from the spirit and scope of the invention set forth in the following claims.

What is claimed is:

1. A method for determining compensated addendum and binder surfaces of a springback compensated stamping die for producing a stamped part, comprising the steps of:
   calculating a plurality of compensatory surface displacements of said die within the boundaries of said stamped part, using a springback compensation model;
   discretizing the existing addendum surface and binder surface of the die as an elastic shell structure, using a finite element model;
   imposing said plurality of compensatory surface displacements as boundary conditions in said finite element model of the addendum surface and binder surface; and
   using said finite element model to conduct an analysis of said existing addendum and binder surfaces to determine compensated addendum and binder surfaces corresponding to the compensated surface of the die within said boundaries of said stamped part.

2. A method according to claim 1, wherein said elastic shell structure is modeled with a defined thickness and a defined elastic modulus.

3. A method according to claim 1, wherein said stamping die comprises a draw die.

4. A method according to claim 1, wherein said analysis of said existing addendum and binder surfaces is limited to analysis of said addendum surface by constraining a plurality of finite element nodes corresponding to said binder surface.

5. A method according to claim 1, wherein in-plane rotations of surfaces of said die calculated by said springback compensation model are imposed as boundary conditions in said finite element model of said addendum surface and said binder surface.

6. A method according to claim 1, wherein said elastic shell structure is modeled with a thickness and elastic modulus corresponding to the thickness and elastic modulus of the material used to form said stamped part.

7. A method for determining compensated addendum and binder surfaces of a springback compensated stamping die for producing a stamped part, comprising the steps of:
   calculating a plurality of compensatory surface displacements and in-plane rotations of said die within the boundaries of said stamped part, using a springback compensation model;
   discretizing the existing addendum surface and binder surface of the die as an elastic shell structure with a defined thickness and a defined elastic modulus, using a finite element model;
   imposing said plurality of compensatory surface displacements and in-plane rotations as boundary conditions in said finite element model of the existing addendum surface and binder surface; and
   using said finite element model to conduct an analysis of said existing addendum and binder surfaces to determine compensated addendum and binder surfaces corresponding to the compensated surface of the die within said boundaries of said stamped part.

8. A method according to claim 7, wherein said displacements are calculated in at least three directions.

* * * * *